(12) United States Patent
Ramchen et al.

(10) Patent No.: US 8,742,448 B2
(45) Date of Patent: Jun. 3, 2014

(54) OPTOELECTRONIC COMPONENT

(75) Inventors: Johann Ramchen, Altdorf (DE); Michael Zitzlsperger, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 13/256,448

(22) PCT Filed: Mar. 5, 2010

(86) PCT No.: PCT/EP2010/052850
§ 371 (c)(1),
(2), (4) Date: Nov. 1, 2011

(87) PCT Pub. No.: WO2010/112298
PCT Pub. Date: Oct. 7, 2010

(65) Prior Publication Data
US 2012/0037929 A1    Feb. 16, 2012

(30) Foreign Application Priority Data
Apr. 2, 2009   (DE) .......................... 10 2009 015 963

(51) Int. Cl.
*H01L 33/36*   (2010.01)
*H01L 33/62*   (2010.01)

(52) U.S. Cl.
CPC ..................................... *H01L 33/62* (2013.01)
USPC .................................. 257/99; 257/81; 257/98

(58) Field of Classification Search
USPC ................... 257/81, 98, 99, 100, 79, E31.111, 257/E31.117, E31.106; 438/32; 372/46.01, 372/50.124; 359/248, 344, 642, 727; 385/2, 385/8
IPC ....................................................... H01L 33/62
See application file for complete search history.

(56) References Cited

U.S. PATENT DOCUMENTS 4,316,204 A * 2/1982 Inagaki et al. ................ 257/432
5,357,056 A   10/1994 Nagano
(Continued)

FOREIGN PATENT DOCUMENTS

| CN | 101110462 A | 1/2008 |
| CN | 101388161 A | 3/2009 |

(Continued)

OTHER PUBLICATIONS

A copy of the Japanese Examination Report dated Jan. 7, 2014 for corresponding Japanese Application No. 2012-502540.

*Primary Examiner* — Eugene Lee
(74) *Attorney, Agent, or Firm* — DLA Piper LLP (US)

(57) ABSTRACT

An optoelectronic component has an optoelectronic semiconductor chip, a contact frame, a contact carrier, a first electrical connection zone and a second electrical connection zone electrically insulated from the first electrical connection zone, which each have a part of the contact frame and a part of the contact carrier, wherein the contact frame has a recess which separates the first electrical connection zone at least in places from the second electrical connection zone and into which the optoelectronic semiconductor chip projects, and wherein the contact frame has a contact element which connects the contact frame electrically with the optoelectronic semiconductor chip.

16 Claims, 2 Drawing Sheets

(56) References Cited

U.S. PATENT DOCUMENTS

| | | | |
|---|---|---|---|
| 6,897,567 B2 * | 5/2005 | Horie | 257/779 |
| 7,499,288 B2 * | 3/2009 | Tanaka et al. | 361/767 |
| 2002/0014704 A1 | 2/2002 | Horie | |
| 2003/0107316 A1 * | 6/2003 | Murakami et al. | 313/512 |
| 2004/0200951 A1 | 10/2004 | Yagi et al. | |
| 2006/0086899 A1 * | 4/2006 | Chao et al. | 250/239 |
| 2006/0102917 A1 | 5/2006 | Oyama et al. | |
| 2007/0081313 A1 | 4/2007 | Tanaka et al. | |
| 2008/0121921 A1 * | 5/2008 | Loh et al. | 257/99 |
| 2008/0224315 A1 | 9/2008 | Miyata et al. | |
| 2008/0237767 A1 | 10/2008 | Chan et al. | |
| 2009/0072251 A1 * | 3/2009 | Chan et al. | 257/89 |
| 2010/0270571 A1 * | 10/2010 | Seo | 257/98 |
| 2011/0233579 A1 | 9/2011 | Loh et al. | |

FOREIGN PATENT DOCUMENTS

| | | |
|---|---|---|
| DE | 103 39 985 A1 | 3/2005 |
| EP | 0 562 550 A1 | 9/1993 |
| EP | 2 081 238 A1 | 7/2009 |
| JP | 53-139990 | 12/1978 |
| JP | 11-054801 | 2/1999 |
| JP | 2007-059570 A | 3/2007 |
| JP | 2008-130735 | 6/2008 |
| TW | 2008-37924 A | 9/2008 |
| TW | 2008-45253 A | 11/2008 |
| WO | 2008/008383 A1 | 7/2008 |
| WO | 2008/080383 A1 | 7/2008 |
| WO | 2009/003442 A1 | 1/2009 |

* cited by examiner

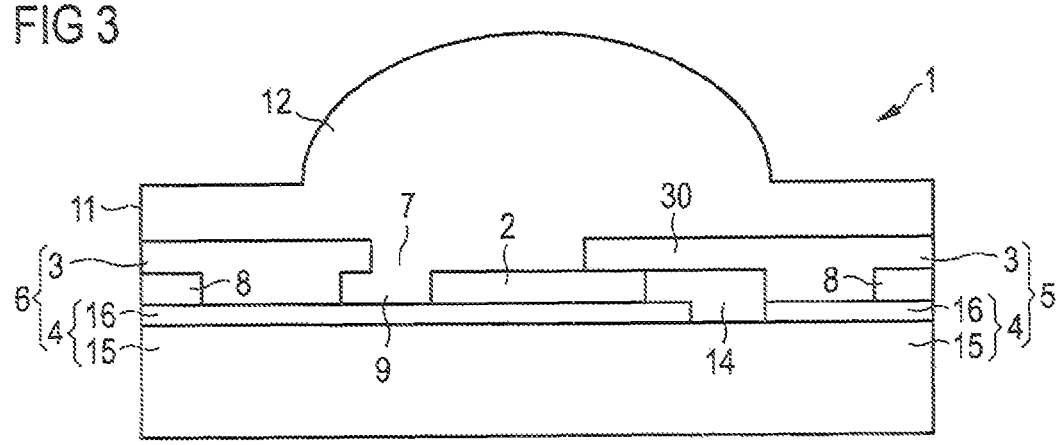
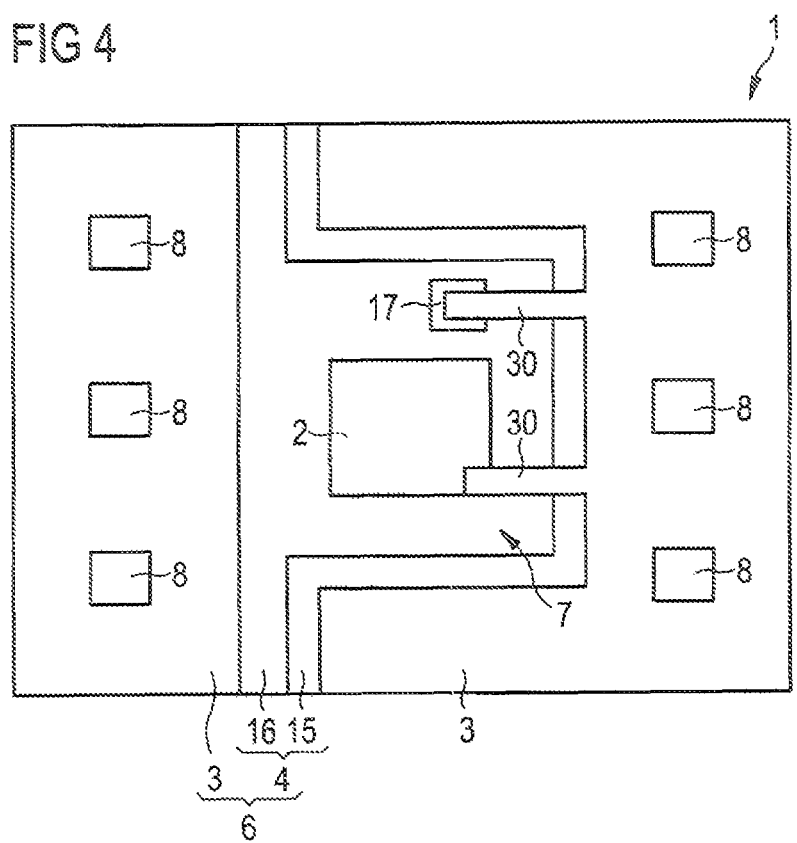

OPTOELECTRONIC COMPONENT

RELATED APPLICATIONS

This application is a §371 of International Application No. PCT/EP2010/052850, with an international filing date of Mar. 5, 2010 (WO 2010/112298, published Oct. 7, 2010), and claims priority from German Patent Application No. 10 2009 015 963.0, filed Apr. 2, 2009, the subject matter of which is incorporated by reference.

TECHNICAL FIELD

This disclosure relates to an optoelectronic component with an optoelectronic semiconductor chip, which has a wireless electrical connection.

BACKGROUND

DE 103 39 985 B4 describes an optoelectronic component with an optoelectronic semiconductor chip, which is electrically connected wirelessly on a radiation exit side by a conductive transparent layer which is applied to a support film. This type of film contacting has proven complex in that an insulating layer has to be provided in places between the transparent layer and the semiconductor chip to avoid a short-circuit inside the component.

It could therefore be helpful to provide an optoelectronic component with an optoelectronic semiconductor chip which has a simple wireless electrical connection.

SUMMARY

We provide an optoelectronic component including an optoelectronic semiconductor chip, a contact frame, a contact carrier, a first electrical connection zone and a second electrical connection zone electrically insulated from the first electrical connection zone, which each include part of the contact frame and part of the contact carrier, wherein the contact frame is provided with a recess which separates the first electrical connection zone at least in places from the second electrical connection zone and into which the optoelectronic semiconductor chip projects, and wherein the contact frame is provided with a contact element which connects the contact frame electrically with the optoelectronic semiconductor chip.

BRIEF DESCRIPTION OF THE DRAWINGS

FIG. 3 shows a schematic cross-sectional view of a third example of an optoelectronic component.

FIG. 4 shows a schematic plan view of a fourth example of an optoelectronic component.

DETAILED DESCRIPTION

Figure 1:
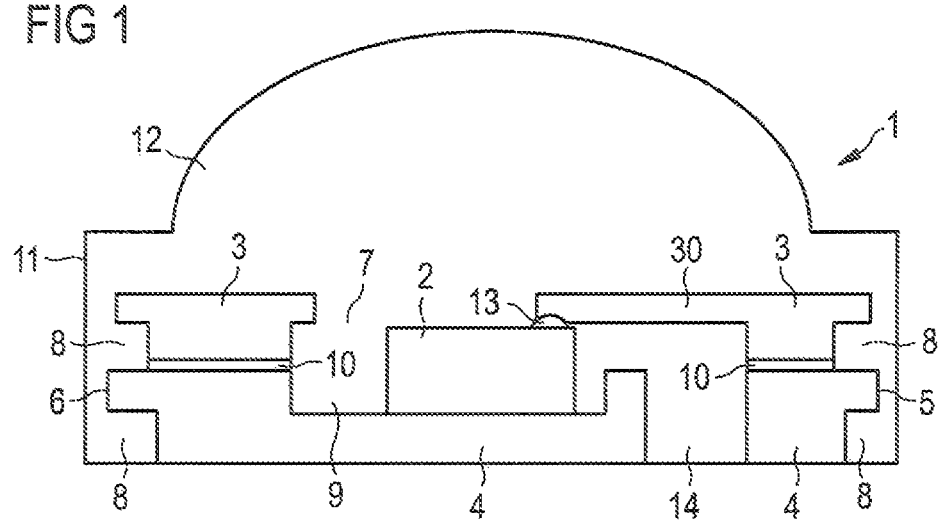
FIG. 1 shows a schematic cross-sectional view of a first example of an optoelectronic component.

Preferably, the optoelectronic component comprises an optoelectronic semiconductor chip, a contact frame, a contact carrier and a first electrical connection zone and a second electrical connection zone electrically insulated from the first electrical connection zone. The two connection zones each comprise part of the contact frame and part of the contact carrier, wherein the contact frame is provided with a recess which separates the first electrical connection zone at least in places from the second electrical connection zone and into which the optoelectronic semiconductor chip projects, and wherein the contact frame is provided with a contact element which connects the contact frame electrically with the optoelectronic semiconductor chip.

The optoelectronic semiconductor chip may be a radiation-emitting or a radiation-receiving semiconductor chip. The optoelectronic semiconductor chip comprises a radiation passage face facing the contact element, the radiation passage face being a radiation exit face in the case of a radiation-emitting semiconductor chip and a radiation entrance face in the case of a radiation-receiving semiconductor chip.

The radiation passage face is preferably connected with the contact element of the contact frame. In particular, the contact element projects into the recess in the contact frame, while the remainder of the contact frame defines the recess. The optoelectronic semiconductor chip is arranged in the recess preferably such that the radiation passing through the radiation passage face may impinge on the contact element, but substantially not on the remainder of the contact frame. Thus, radiation losses caused by shading at the contact frame may be minimized.

Electrical supply to the optoelectronic semiconductor chip is possible by the first and second electrical connection zones. Both the contact frame and the contact carrier, of which the two connection zones are composed, advantageously comprise an electrically conductive material.

Preferably, the optoelectronic semiconductor chip is a radiation-emitting semiconductor chip. To generate radiation, the optoelectronic semiconductor chip comprises an active zone with a pn-junction formed in the simplest case of a p-conducting and an n-conducting semiconductor layer which directly adjoin one another. Preferably, the actual radiation-producing structure is provided between the p-conducting and n-conducting semiconductor layers, for instance in the form of a doped or undoped quantum layer. The quantum layer may take the form of a single quantum well structure (SQW), a multiple quantum well structure (MQW), a quantum wire or a quantum dot structure.

Advantageously, the contact element is part of the first connection zone and wirelessly connects the optoelectronic semiconductor chip with the first connection zone.

The contact element may be of strip-like construction, for example. The contact element advantageously rests on the radiation passage face. An electrically conductive agent may be provided between the semiconductor chip and the contact element, for example, a soldering agent or adhesive which connects the contact element electrically with the semiconductor chip.

Furthermore, the optoelectronic semiconductor chip may be arranged on the contact carrier of the second connection zone. The optoelectronic semiconductor chip is electrically connected wirelessly in particular with the contact carrier. The semiconductor chip may be attached to the contact carrier by die bonding.

Preferably, the contact frame and the contact carrier are of one-piece construction. For example, the contact frame and the contact carrier may be made in one-piece from a single workpiece such as sheet metal. The workpiece is advantageously structured such that it comprises a recess for the semiconductor chip and a contact element for electrical contacting of the semiconductor chip. In addition, the workpiece is subdivided such that a first and a second connection zone are consequently present. The one-piece configuration of contact frame and contact carrier allows simple production of the first and second connection zones.

Further, the contact frame and the contact carrier may be two separate elements. This has the advantage, for example, that an electrically insulating agent may be arranged in places between contact frame and contact carrier such that the contact frame is insulated electrically from the contact carrier in the region where the electrically insulating agent is located. It is thus possible, for example, to provide a first and second connection zone with a common contact carrier which extends continuously from the first connection zone to the second connection zone.

In particular, the contact frame is arranged on the contact carrier. Preferably, the contact frame is connected non-detachably with the contact carrier. The contact frame is advantageously connected with the contact carrier at least in places by an electrically conductive agent. For example, the contact frame may be adhesively bonded, eutectically bonded or soldered to the contact carrier.

Preferably, the contact frame is made from a single workpiece, preferably from sheet metal. The workpiece is advantageously structured such that it comprises a recess for the semiconductor chip and a contact element for electrical contacting of the semiconductor chip.

Like the contact frame, the contact carrier may also be made from a single workpiece, preferably from sheet metal. The workpiece is advantageously structured such that it comprises a recess for the semiconductor chip, to the bottom of which the semiconductor chip may be attached.

Alternatively, the contact carrier may comprise a substrate with at least one electrically conductive zone. Together with the contact frame, the at least one electrically conductive zone of the contact carrier forms the first or second electrical connection zone. The substrate may contain an electrically conductive or slightly conductive material or an electrically insulating material. A particularly suitable material is one which has good thermal conductivity to cool the semiconductor chip sufficiently. For example, the substrate may contain a ceramic material, a semiconductor material or a plastics material. In the case of a slightly electrically conductive or electrically insulating substrate, the at least one electrically conductive zone may be produced by applying a metal coating to the substrate. In the case of an electrically conductive substrate, the substrate may be covered in places with an electrically insulating material, such that the area of the substrate not covered by the electrically insulating material forms the electrically conductive zone.

Preferably, the assembly of optoelectronic semiconductor chip, contact frame and contact carrier is embedded in an encapsulation. A compact structure of this type advantageously does not require any additional housing.

The encapsulation may be made from a potting compound or an injection molding compound. Preferably, the encapsulation contains a silicone.

In a further configuration of the optoelectronic component, in addition to the recess for the semiconductor chip, the contact frame comprises further recesses on a side facing or remote from the contact carrier. In particular, the further recesses are filled with the encapsulation material. In this way, the encapsulation may be anchored in the contact frame.

Preferably, the encapsulation comprises an optical structure provided for beam shaping. Taking the optoelectronic semiconductor chip as a starting point, the optical structure is arranged downstream of the contact frame. The encapsulation may, for example, comprise a convexly curved surface such that the optical structure is a convex lens which concentrates the radiation passing therethrough.

Furthermore, in addition to the optoelectronic semiconductor chip, the optoelectronic component may comprise a further semiconductor chip. In addition, the contact frame advantageously comprises a further contact element connected with the further semiconductor chip. The optoelectronic semiconductor chip may be connected in series, in parallel or in antiparallel with the further semiconductor chip. For example, the further semiconductor chip is a radiation-emitting or radiation-receiving semiconductor chip or a protection diode.

Preferably, a method for producing the optoelectronic component is a series production. To this end, use is made in particular of a contact frame unit which comprises a plurality of contact frames for a plurality of optoelectronic components, and a contact carrier unit which comprises a plurality of contact carriers for a plurality of optoelectronic components. The unit comprising semiconductor chips, contact frame unit and contact carrier unit is singulated such that, after singulation, a plurality of optoelectronic components is obtained.

Advantageously, two separate elements are provided for the contact frame unit and the contact carrier unit.

The contact frame unit may be made from a single workpiece. In particular, sheet metal is used as the workpiece.

Preferably, the workpiece is provided with recesses which extend continuously from a first major face to a second major face of the workpiece opposite the first major face. At least one semiconductor chip may be arranged in each case in the recesses. To form the continuous recesses the workpiece may be etched in part starting from the first major face and correspondingly in part starting from the second major face. In addition, at least one contact element is in each case produced, which projects into the recess.

Further recesses for anchoring an encapsulation may be etched into the workpiece, starting from the first or second major face, wherein the recesses need not extend completely through the workpiece.

The contact carrier unit may be made in two different ways. A first option is to make the contact carrier unit from a single workpiece which is, in particular, sheet metal. A second option is to use a substrate for the contact carrier unit which comprises electrically conductive zones.

If the contact carrier unit is made from a single workpiece, recesses are preferably formed in the workpiece to the bottom of which recesses at least one semiconductor chip may in each case be attached. The recesses may be etched into the workpiece starting from a first major face thereof In addition, starting from the first major face of the workpiece or a second major face which is opposite the first major face, further recesses may be etched into the workpiece to anchor an encapsulation, which recesses extend partially or completely through the workpiece.

If a substrate with electrically conductive zones is used for the contact carrier unit, the substrate advantageously contains a ceramic material, a semiconductor material or a plastics material. In particular, an electrically conductive coating, preferably a metal coating, is applied in places to a major face of the substrate such that the substrate comprises electrically conductive zones on the major face.

On the contact carrier unit, the semiconductor chips are attached to the zones provided therefor. This may take place in series or batch production. In particular, the semiconductor chips are soldered to the contact carrier unit.

The contact frame unit is then placed onto the contact carrier unit. The contact frame unit may comprise interconnected contact frames or separate contact frames which are placed separately onto the contact carrier unit. In addition, the contact carrier unit may comprise interconnected contact carriers or separate contact carriers.

The contact frame unit is connected electrically conductively at least in places with the contact carrier unit. The contact frame unit may be adhesively bonded, eutectically bonded or soldered to the contact carrier unit.

The contact frame unit is advantageously placed onto the contact carrier unit such that the semiconductor chips project into the respective recesses provided therefor in the contact frames. In particular, the semiconductor chips project so far into the corresponding recesses that they come into contact with the contact element of the contact frame. Thus, the semiconductor chips may be electrically contacted by placing the contact frame unit onto the contact carrier unit. To assist in electrical connection, an electrically conductive agent may be arranged between semiconductor chip and contact element, for example, a conductive adhesive or a solder joint.

Further, the contact frame unit and the contact carrier unit may be made in one piece. In particular, a single workpiece, for example, sheet metal, is used for this purpose. Formation of the recesses for the semiconductor chip and the further recesses for anchoring an encapsulation may proceed as in the case of the above-described two-part production of the contact frame unit and contact carrier unit.

In all the described methods, the assembly of contact frame unit, contact carrier unit and semiconductor chip may be embedded in an encapsulation, which in particular contains a silicone. This may be achieved, for example, by potting or injection molding.

Advantageous examples of an optoelectronic component are explained below in greater detail with reference to FIGS. 1 to 4.

Identical or identically acting elements are provided with identical reference numerals in the Figures.

FIG. 1 shows an optoelectronic component 1 which comprises an optoelectronic semiconductor chip 2 and a contact frame 3 and a contact carrier 4. Preferably, the optoelectronic semiconductor chip 2 is a radiation-generating semiconductor chip.

The contact frame 3 and the contact carrier 4 are separate elements, the contact frame 3 being attached to the contact carrier 4 at least in places by an electrically conductive agent 10. The contact frame 3 may, for example, be adhesively bonded, eutectically bonded or soldered to the contact carrier 4.

The contact frame 3 and the contact carrier 4 contain an electrically conductive material. In particular, the contact frame 3 and the contact carrier 4 are in each case made of sheet metal.

Both the contact frame 3 and the contact carrier 4 are of two-part construction. To this end, the contact frame 3 is provided with a recess 7 which divides the contact frame 3 into two parts. Likewise, the contact carrier 4 comprises a recess 14 which divides the contact carrier 4 into two parts.

Together with a first part of the contact carrier 4, a first part of the contact frame 3 forms a first connection zone 5. In addition, together with a second part of the contact carrier 4, a second part of the contact frame 3 forms a second connection zone 6. The first connection zone 5 is insulated electrically from the second connection zone 6 by the recesses 7 and 14 in which an electrically insulating medium is located.

A recess 9 is formed on a side of the contact carrier 4 facing the contact frame 3, on the bottom of which recess 9 there is arranged the rear of the optoelectronic semiconductor chip 2. In particular, the optoelectronic semiconductor chip 2 is connected electrically conductively with the contact carrier 4. The optoelectronic semiconductor chip 2 may be soldered to the contact carrier 4. In this way, the semiconductor chip 2 is electrically connected wirelessly to the second connection zone 6.

The optoelectronic semiconductor chip 2 projects with its front into the recess 7 of the contact frame 3. The semiconductor chip 2 projects far enough into the recess 7 for a radiation passage face of the semiconductor chip 2 to come into contact with a contact element 30 of the contact frame 3. An electrically conductive agent 13 is arranged between the contact element 30 and the semiconductor chip 2, which agent electrically connects the contact element 30 and the semiconductor chip 2. The optoelectronic semiconductor chip 2 is thus electrically connected wirelessly with the first connection zone 5.

The recess 7 is dimensioned in particular such that the radiation passage face of the semiconductor chip 2 is not covered by the contact frame 3 such that radiation generated by the semiconductor chip 2 may pass unhindered through the recess 7 and be coupled out of the optoelectronic component 1. The contact element 30 of the contact frame 3 covers a negligibly small part the radiation passage face of the semiconductor chip 2.

Circumferentially, the semiconductor chip 2 is surrounded for the most part by the first and second connection zones 5, 6 such that laterally emitted radiation may impinge on the first or second connection zones 5, 6, be reflected in the direction of the recess 7 and be coupled out of the optoelectronic component 1.

The assembly of optoelectronic semiconductor chip 2, contact frame 3 and contact carrier 4 is embedded in an encapsulation 11. An additional housing may advantageously be dispensed with. The encapsulation 11 in particular contains a radiation-transmissive electrically insulating material such as silicone.

On their undersides, the contact frame 3 and the contact carrier 4 comprise further recesses 8 preferably filled with the encapsulation material. The encapsulation 11 may be anchored in the contact frame 3 and in the contact carrier 4 by the recesses 8.

In addition, the recesses 7 and 9 are also filled with the encapsulation material such that the semiconductor chip 2 is protected. Furthermore, the recess 14 is also filled with the encapsulation material. The first and second connection zones 5, 6 are electrically insulated from one another by the electrically insulating encapsulation material arranged in the recesses 7 and 14.

The encapsulation 11 comprises an optical structure 12 designed for beam shaping. Taking the optoelectronic semiconductor chip 2 as a starting point, the optical structure 12 is arranged downstream of the contact frame 3. The encapsulation 11 comprises a convexly curved surface such that the optical structure 12 is a convex lens which concentrates the radiation passing therethrough.

Figure 2:
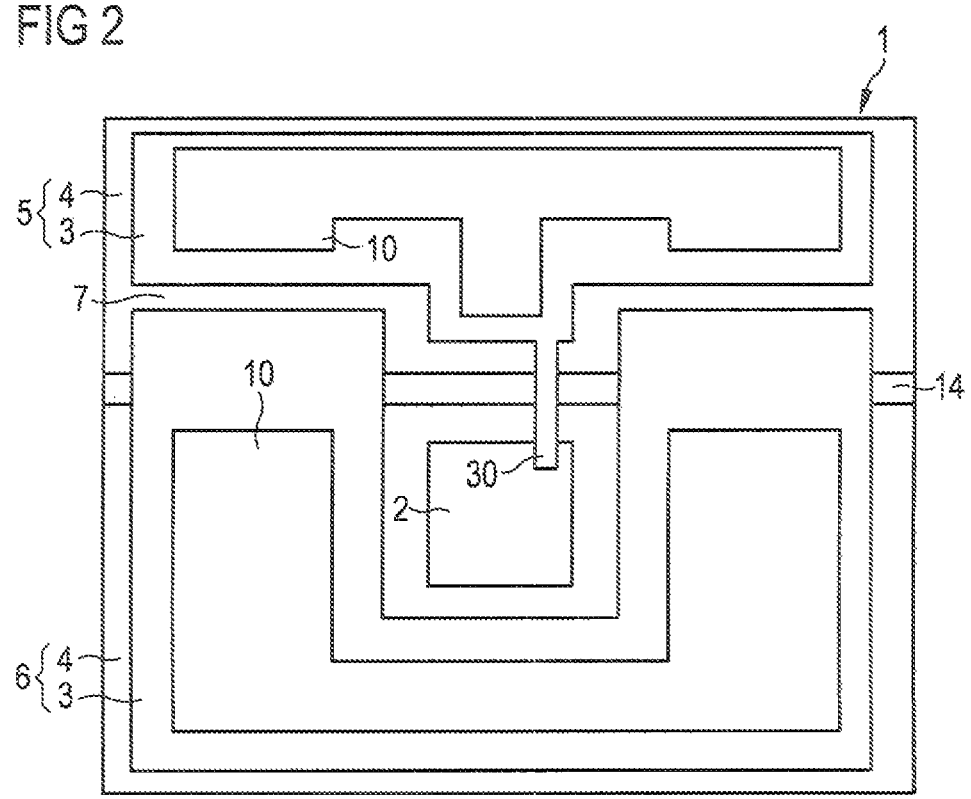
FIG. 2 shows a schematic plan view of a second example of an optoelectronic component.

FIG. 2 shows a further example of an optoelectronic component 1 in plan view. The optoelectronic semiconductor chip 2 is arranged on a mounting face of the contact carrier 4 provided therefor. The contact carrier 4 is of two-part construction, the two parts of the contact carrier 4 being separated from one another by the recess 14. For electrical insulation of the two parts, the recess 14 is filled with an electrically insulating material, in particular, a plastics material. The two parts of the contact carrier 4 have a rectangular outline.

The contact frame 3 is arranged on the contact carrier 4. The contact frame 3 is also of two-part construction, the two parts of the contact frame 3 being separated from one another by the recess 7. The part of the contact frame 3 associated with the second connection zone 6 surrounds the semiconductor chip 2 in a U shape. The part of the contact frame 3 associated with the first connection zone 5 completes the U-shaped part in such a way that the semiconductor chip 2 is surrounded on all four sides by the contact frame 3. This part of the contact frame 3 comprises the contact element 30, which rests on the radiation passage face of the semiconductor chip 2 and electrically connects the semiconductor chip 2 wirelessly with the first connection zone 5.

Preferably, both the contact frame 3 and the contact carrier 4 are made from a single workpiece, in particular, sheet metal.

FIG. 3 shows an example of an optoelectronic component 1 in which the contact carrier 4 is not made from a single workpiece. The contact carrier 4 comprises a substrate 15 with two electrically conductive zones 16 separated from one another by the recess 14. The substrate 15 is preferably only slightly or not at all electrically conductive. It may, for example, contain a ceramic material, a semiconductor material or a plastics material. The substrate 15 is metallized, the metal coating being structured such that it comprises the two mutually separate electrically conductive zones 16.

The contact frame 3 is arranged on the contact carrier 4. The frame is constructed in accordance with the contact frame 3 shown in FIG. 1, i.e., it is preferably made from a single workpiece, in particular, sheet metal. The contact frame 3 is placed on the contact carrier 4 such that the first part of the contact frame 3 of two-part construction is connected only with the one electrically conductive zone 16 of the contact carrier 4 and the second part only with the other electrically conductive zone 16 of the contact carrier 4.

In other aspects, the optoelectronic component 1 illustrated in FIG. 3 resembles the optoelectronic component 1 illustrated in FIG. 1.

FIG. 4 shows a further example of an optoelectronic component 1, the contact carrier 4 of which, corresponding to the component 1 shown in FIG. 3, comprises a substrate 15 with mutually separate electrically conductive zones 16 (only one zone is visible).

The contact frame 3 is preferably made from a single workpiece, in particular, sheet metal. The contact frame 3 comprises recesses 8 which extend from a first major face remote from the contact carrier 4 as far as a major face of the contact frame 3 opposite the first major face. These recesses 8 are suitable to anchor an encapsulation (not shown).

In addition to the optoelectronic semiconductor chip 2, the optoelectronic component 1 comprises a further semiconductor chip 17. In this example, the semiconductor chip 17 is a protection diode, whose pn-junction is arranged in opposition to the pn-junction of the optoelectronic semiconductor chip 2.

In addition to the contact element 30 provided for the optoelectronic semiconductor chip 2, the contact frame 3 comprises a further contact element 30 which electrically conductively connects the top of the further semiconductor chip 17 with the contact frame 3 of the first connection zone. The contact frame 3 does not exhibit any interruption between the two contact elements such that the two semiconductor chips 2, 17 are exposed to the same potential via the contact frame 3 when in operation.

The two semiconductor chips 2, 17 are arranged with their undersides on a part of the electrically conductive zone 16 which projects into the recess 7. This part of the electrically conductive zone 16 has a rectangular shape conformed to the likewise rectangular shape of the semiconductor chips 2. This shape may be more readily achieved in this example by suitable structuring of the metal coating from which the electrically conductive zone 16 is preferably made than in the case of a contact carrier made from a solid workpiece.

The underside of the two semiconductor chips 2, 17 is connected electrically with the electrically conductive zone 16. The electrically conductive zone 16 does not exhibit any interruption between the semiconductor chips 2, 17 such that the two semiconductor chips 2, 17 are exposed to the same potential when in operation via the electrically conductive zone 16 and the contact frame 3, connected therewith, of the second connection zone 6.

In this example, therefore, the two semiconductor chips 2, 17 are connected in antiparallel when in operation.

This disclosure is not restricted by the description given with reference to the examples. Rather, the disclosure encompasses any novel feature and any combination of features, including in particular any combination of features in the claims, even if the feature combination is not itself explicitly indicated in the claims or examples.

The invention claimed is:

1. An optoelectronic component comprising:
   an optoelectronic semiconductor chip,
   a contact frame,
   a contact carrier,
   a first electrical connection zone and a second electrical connection zone electrically insulated from the first electrical connection zone, which each comprise part of the contact frame and part of the contact carrier, wherein
   1) the contact frame is provided with a recess which separates the first electrical connection zone at least in places from the second electrical connection zone and into which the optoelectronic semiconductor chip projects,
   2) the contact frame is provided with a contact element which connects the contact frame electrically with the optoelectronic semiconductor chip, and 3) the optoelectronic semiconductor chip is arranged on the contact carrier of the second connection zone and electrically connected wirelessly with the contact carrier and the optoelectronic semiconductor chip is not arranged on the contact frame of the second connection zone.

2. The optoelectronic component according to claim 1, wherein
   the contact element is part of the first connection zone and electrically connects the optoelectronic semiconductor chip wirelessly with the first connection zone.

3. The optoelectronic component according to claim 1, wherein
   the contact frame and the contact carrier are a one-piece construction.

4. The optoelectronic component according to claim 3, wherein
   the contact frame and the contact carrier are made in one piece from sheet metal and the sheet metal is subdivided to form the first and second connection zones.

5. The optoelectronic component according to claim 1, wherein
   the contact frame and the contact carrier are two separate elements.

6. The optoelectronic component according to claim 5, wherein
   the contact frame is arranged on the contact carrier.

7. The optoelectronic component according to claim 5, wherein the contact frame is adhesively bonded, eutectically bonded or soldered in selected locations to the contact carrier.

8. The optoelectronic component according to claim 5, wherein
   the contact frame is made from sheet metal.

9. The optoelectronic component according to claim 5, wherein the contact carrier is made from sheet metal.

10. The optoelectronic component according to claim 5, wherein the contact carrier comprises a substrate with at least one electrically conductive zone, and the substrate contains a ceramic material, a semiconductor material or a plastics material.

11. The optoelectronic component according to claim 1, wherein the contact frame comprises further recesses on a side facing or remote from the contact carrier.

12. The optoelectronic component according to claim 1, wherein the optoelectronic semiconductor chip, contact frame and contact carrier are embedded in an encapsulation.

13. The optoelectronic component according to claim 11, wherein the further recesses are filled with the encapsulation material.

14. The optoelectronic component according to claim 1, further comprising another semiconductor chip, wherein the contact frame comprises a further contact element connected with the another semiconductor chip, and wherein the optoelectronic semiconductor chip and the another semiconductor chip are connected in series, in parallel or in antiparallel.

15. The optoelectronic component according to claim 1, wherein the optoelectronic semiconductor chip is directly arranged on the contact carrier of the second connection zone.

16. The optoelectronic component according to claim 1, wherein the optoelectronic semiconductor chip is soldered to the contact carrier of the second connection zone.

\* \* \* \* \*